(12) United States Patent
Tu

(10) Patent No.: US 9,349,419 B1
(45) Date of Patent: May 24, 2016

(54) METHOD FOR CONTROLLING AN INTERNAL SUPPLY VOLTAGE BASED ON A CLOCK FREQUENCY OF AN EXTERNAL CLOCK SIGNAL AND A LOOK-UP TABLE

(71) Applicant: Winbond Electronics Corp., Taichung (TW)

(72) Inventor: Ying-Te Tu, Kaohsiung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 14/979,530

(22) Filed: Dec. 28, 2015

Related U.S. Application Data

(62) Division of application No. 13/658,834, filed on Oct. 24, 2012, now Pat. No. 9,269,406.

(51) Int. Cl.
*G11C 5/14* (2006.01)

(52) U.S. Cl.
CPC ..................... *G11C 5/148* (2013.01)

(58) Field of Classification Search
CPC ........ G11C 5/144; G11C 5/143; G11C 5/141; G11C 5/148; G11C 5/147
See application file for complete search history.

(56) References Cited

U.S. PATENT DOCUMENTS

| 7,443,739 | B2* | 10/2008 | Barth | G11C 11/4074 365/189.08 |
| 7,652,944 | B2* | 1/2010 | Iwaya | G11C 5/005 307/65 |
| 9,269,406 | B2* | 2/2016 | Tu | G11C 5/147 |

\* cited by examiner

*Primary Examiner* — Andrew Q Tran
(74) *Attorney, Agent, or Firm* — Jianq Chyun IP Office

(57) ABSTRACT

A control circuit, a memory device and a voltage control method thereof are provided. The memory device includes a memory cell, a voltage regulator circuit and the control circuit. The control circuit receives a clock signal, and determines a clock frequency of the clock signal so as to generate a control signal. An operation voltage is converted into an internal supply voltage for supplying the control circuit by the voltage regulator circuit according to the control signal.

8 Claims, 5 Drawing Sheets

METHOD FOR CONTROLLING AN INTERNAL SUPPLY VOLTAGE BASED ON A CLOCK FREQUENCY OF AN EXTERNAL CLOCK SIGNAL AND A LOOK-UP TABLE

CROSS-REFERENCE TO RELATED APPLICATION

This application is a divisional application of and claims the priority benefit of an U.S. utility patent application Ser. No. 13/658,834, filed on Oct. 24, 2012, now allowed. The entirety of the above-mentioned patent application is hereby incorporated by reference herein and made a part of this specification.

TECHNICAL FIELD

The disclosure relates to a voltage control technology of a memory device, and particularly relates to a control circuit, a memory device, and a voltage control method thereof.

BACKGROUND

The conventional technology usually increases the processing speed of central processing unit (CPU) chips by elevating an operation voltage or overclocking. However, such method for increasing speed is only effective to CPU chips. For the conventional memory devices, the internal supply voltage of the memory devices remains at a constant value regardless of variation of the operation voltage being applied. This is to say that the processing speed of the memory devices remains the same. Therefore, it is not feasible to make use of an external signal of the memory devices to adjust the internal supply voltage. Consequently, the processing speed of the memory devices cannot be increased.

SUMMARY

In view of the above, the disclosure provides a control circuit, a memory device, and a voltage control method thereof to touch upon the issue noted in the prior art.

The disclosure provides a memory device, including a memory cell, a voltage regulator circuit, and a control circuit. The voltage regulator circuit is coupled to a memory cell. The control circuit is coupled to the memory cell and the voltage regulator circuit. The control circuit receives a clock signal and detelinines a clock frequency of the clock signal, so as to generate a control signal. The voltage regulator circuit converts an operation voltage into an internal supply voltage for supplying the control circuit based on the control signal.

In an embodiment of the disclosure, the control circuit detelinines whether the clock frequency is in a frequency-dropping state, wherein if the clock frequency is in the frequency-dropping state, the control signal makes the voltage regulator circuit tune down the internal supply voltage, and if the clock frequency is at a frequency-elevating state, the control signal makes the voltage regulator circuit tune up the internal supply voltage.

The disclosure also provides a control circuit in a memory device. The control circuit is coupled to a voltage regulator circuit. The control circuit receives a clock signal and determines a clock frequency of the clock signal to generate a control signal, wherein the voltage regulator circuit converts an operation voltage into an internal supply voltage for supplying the control circuit based on the control signal.

The disclosure further provides a voltage control method of a memory device, including the following. A clock signal is received. And an operation voltage is converted into a corresponding internal supply voltage by referring to a clock frequency of the clock signal for supplying an internal circuit of the memory device.

In an embodiment of the disclosure, converting the operation voltage into the corresponding internal supply voltage by referring to the clock frequency of the clock signal for supplying the internal circuit of the memory device includes determining whether the clock frequency is in a frequency-dropping state, wherein if the clock frequency is in the frequency-dropping state, the internal supply voltage is tuned down, and if the clock frequency is in a frequency elevating state, the internal supply voltage is tuned up.

In view of the above, the disclosure automatically adjusts a level of the internal supply voltage by detecting the clock frequency or frequency variation of the clock signal. When it is detected that the external clock frequency is elevated, the internal supply voltage is automatically elevated to achieve a preferable performance, and when it is detected that the external clock frequency is dropped, the internal supply voltage is automatically dropped to a potential that maintains normal functioning.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
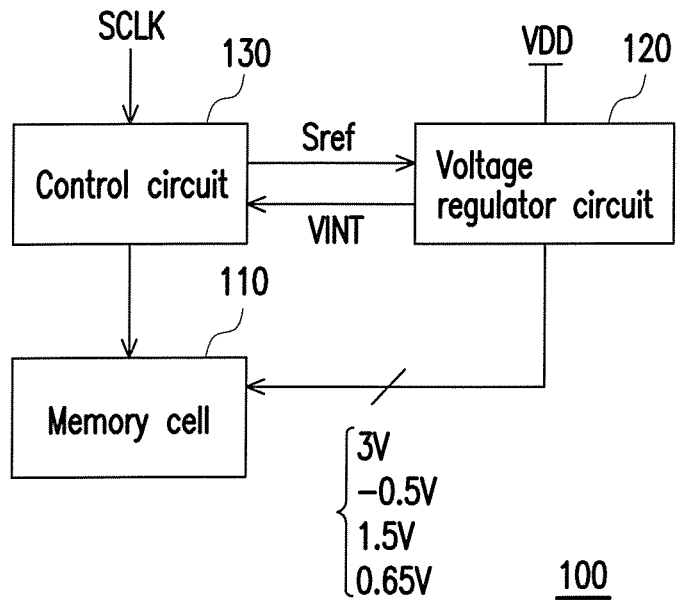
FIG. 1 is a schematic view of a memory device according to an embodiment of the disclosure.
Figure 2:
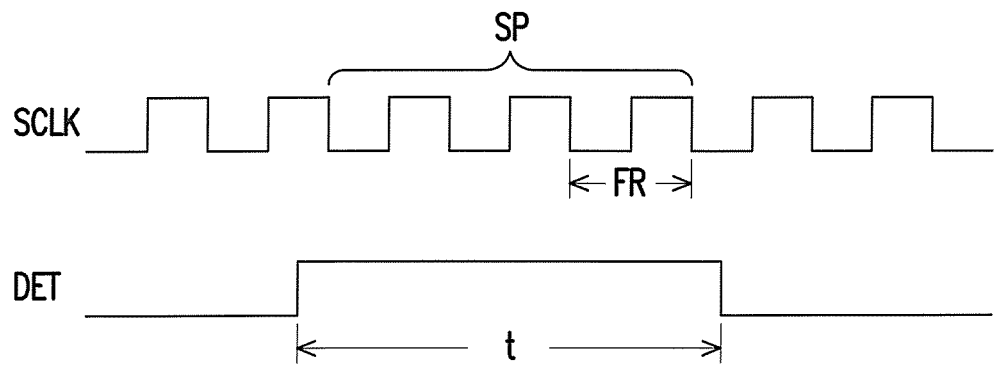
FIG. 2 is a schematic view of a clock signal according to an embodiment of the disclosure.

FIG. 1 is a schematic view of a memory device 100 of an embodiment of the disclosure. FIG. 2 is a schematic view of a clock signal SCLK of FIG. 1. Referring FIGS. 1 and 2 together. A control circuit 130 is coupled to a voltage regulator circuit 120. The control circuit 130 regularly receives the clock signal SCLK and determines a clock frequency FR of the clock signal SCLK to generate a control signal Sref to the voltage regulator circuit 120. The voltage regulator circuit 120 is coupled to a memory cell 110. The voltage regulator circuit 120 may convert an operation voltage VDD into an adjustable internal supply voltage VINT for supplying the control circuit 130 based on the control signal Sref. In addition, the voltage regulator circuit 120 may further convert the operation voltage VDD into a plurality of fixed operation voltages, such as 3V, −0.5V, 1.5V, and 0.65V, for supplying the memory cell 110.

In an embodiment, the control circuit 130 may infer the clock frequency FR by determining a pulse wave number of the clock signal SCLK. Referring to FIG. 2 again, the control circuit 130 generates a signal DET with a fixed width. In addition, during a period (predetermined period t) in which the signal DET is at a logic high-level, a pulse wave number SP of the clock signal SCLK that is covered is counted, so as to infer the clock frequency FR of the signal clock SCLK. As illustrated in FIG. 2, in the predetermined period t, the signal DET covers three pulse waves of the clock signal SCLK in total. It is therefore inferred that the frequency FR is 3/t.

Subsequently, by referring the clock frequency FR (or the pulse wave number SP), the control circuit 130 outputs the control signal Sref to control operation of the voltage regulator circuit 120 that is used to adjust the internal supply voltage VINT for supplying the control circuit 130. Adjusting the internal supply voltage VINT may be performed with reference to a look-up table.

TABLE 1

| The Pulse Wave Number in the Predetermined Period | Clock Frequency in the Predetermined Period | The Corresponding Internal Supply Voltage |
|---|---|---|
| <2 | <2/t | 1.2 V |
| 2-10 | 2/t-10/t | 1.5 V |
| 11-15 | 11/t-15/t | 1.8 V |
| >15 | >15/t | 2 V |

Table 1 is a look-up table that keeps record of a set of relations between the pulse wave number SP, clock frequency FR, and the corresponding internal supply voltage in the predetermined period. When the control circuit 130 controls operation of the voltage regulator circuit 120 with reference to Table 1, the following conditions occur.

(1) The clock frequency FR being lower than 2/t indicates that the internal supply voltage VINT is to be tuned down to 1.2V.

(2) The clock frequency FR ranging between 2/t to 10/t indicates that the internal supply voltage VINT is to be tuned at 1.5V.

(3) The clock frequency FR ranging between 11/t to 15/t indicates that the internal supply voltage VINT is to be tuned at 1.8V.

(4) The clock frequency FR being higher than 15/t indicates that the internal supply voltage VINT is to be tuned at a highest potential, such as 2V.

It should be noted that the look-up list adopted in the disclosure is not limited to the content of Table 1. Any value that can be used to indirectly infer a feature value of the clock frequency FR, such as the pulse wave number SP, may be used in a look-up process.

In another embodiment, the control circuit 130 may further determine variation of the clock frequency FR and make further use of the look-up table. When the clock signal SCLK is in a frequency-dropping state, the control circuit 130 outputs the control signal Sref to make the voltage regulator circuit 120 tune down the internal supply voltage VINT. When the clock signal SCLK is in a frequency-elevating state, the control signal Sref output by the control circuit 130 makes the voltage regulator circuit 120 tune up the internal supply voltage VINT.

Figure 3:
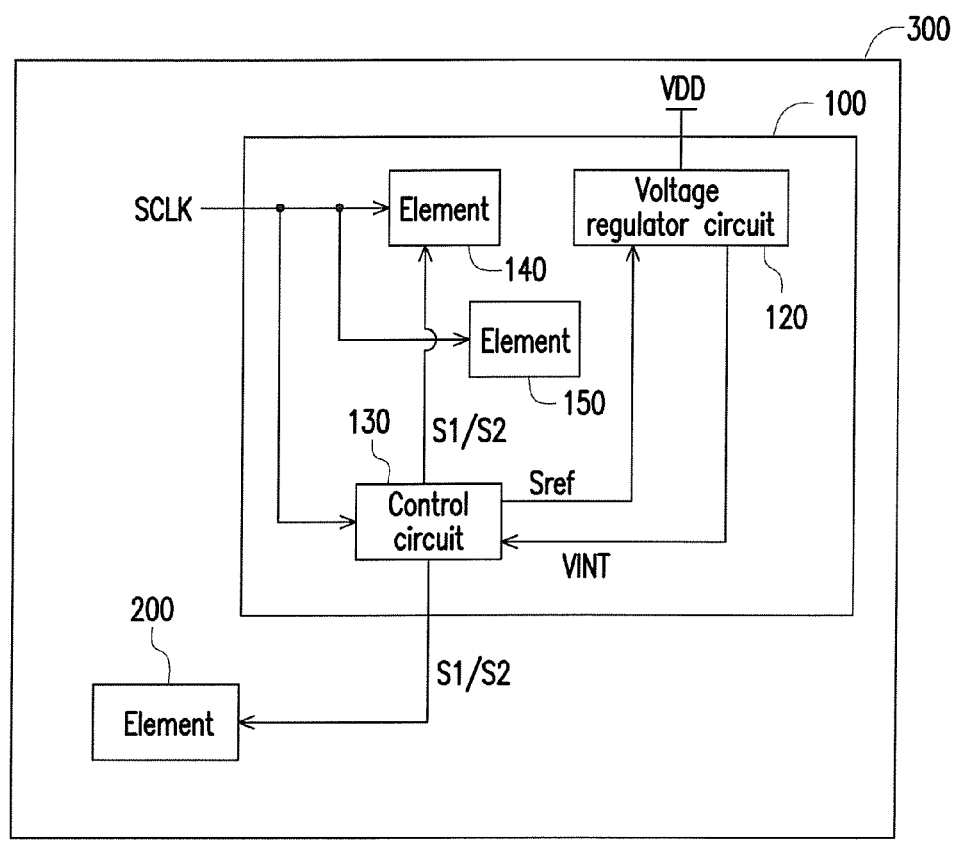
FIG. 3 is a schematic view of a memory system according to an embodiment of the disclosure.

Referring to FIG. 3, FIG. 3 is a schematic view of a memory system 300 according to an embodiment of the disclosure. In this embodiment, the control circuit may turn on or off the elements 130 or 140 or 200 in a memory system 300 by referring to the clock frequency FR (or frequency variation).

For example, when the clock frequency FR (or system frequency) is lower than a first frequency or is in the frequency-dropping state, the control circuit 130 provides a disable signal S1 for completely turning off an unnecessary element to reduce power consumption. When the clock frequency FR is higher than a second frequency or is in the frequency-elevating state, the control circuit 130 provides an enable signal S2 for turning on an element to be operated and improving system performance. Similarly, when the clock frequency FR is lower than the first frequency or is in the frequency-dropping state, the control circuit 130 may also enable and turn on an element, whereas when the clock frequency FR is higher than the second frequency or is in the frequency-elevating state, the control circuit may also disable and turn off an element. For example, an element 200 being turned on or off is a heat dissipation device. For example, given that an element 140 is an input receiver, the enable signal S2 makes the element 140 automatically change from an inverter type to a differential type, so as to improve a responding speed of the memory device 100 itself to high frequency. However, the disable signal S1 makes the element 140 operate in an opposite way. It should be noted that the disclosure does not limit a position at which an element is located. An element internal or external to the memory device 100 may be turned on or off by the control circuit 130.

Figure 4:
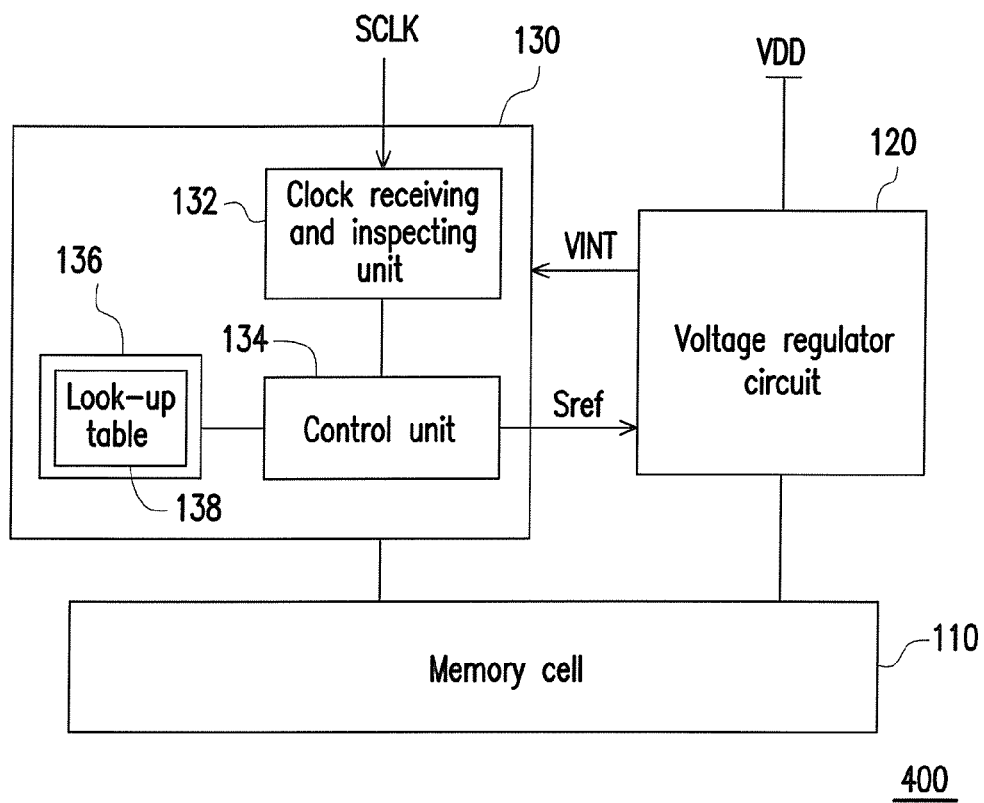
FIG. 4 is a schematic view of a memory device according to an embodiment of the disclosure.

Referring to FIG. 4, FIG. 4 is a schematic view of a memory device 400 according to an embodiment of the disclosure. The control circuit 130 includes a clock receiving and inspecting unit 132, a control unit 134, and a storage unit 136. The clock receiving and inspecting unit 132 receives the clock signal SCLK and determines the clock frequency FR of the clock signal SCLK. The storage unit 136 stores a look-up table 138 having a set of feature values corresponding to the internal supply voltage VINT. The control unit 134 is coupled to the clock receiving and inspecting unit 132, storage unit 136 and voltage regulator circuit 120. The control unit 134 finds a feature value corresponding to the internal supply voltage VINT from the look up table 138, thereby outputting the control signal Sref for the voltage regulator circuit 120 to adjust the internal supply voltage VINT to a set value.

Figure 5:
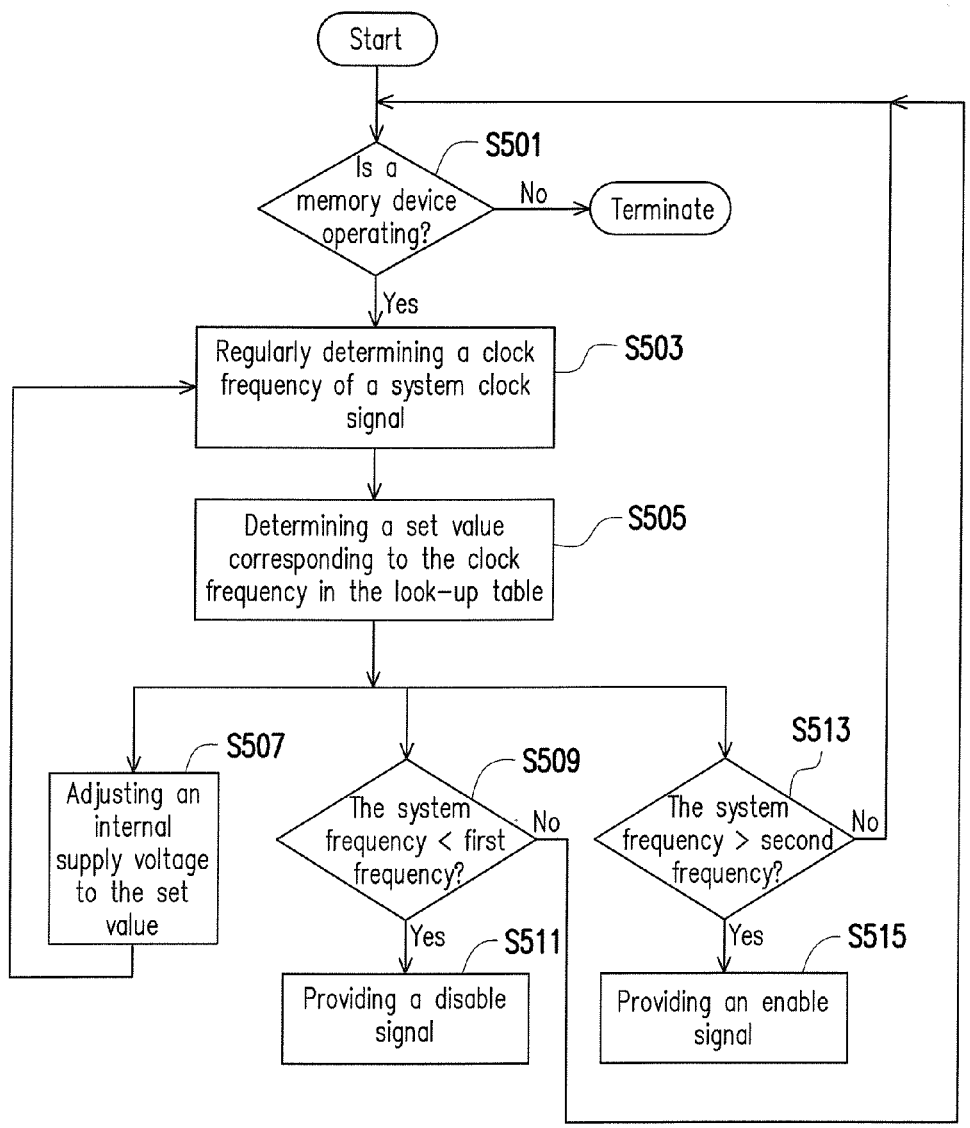
FIG. 5 is a control flowchart of a memory system according to an embodiment of the disclosure.

Referring to FIG. 5, FIG. 5 is a control flowchart of a memory system according to an embodiment of the disclosure. First, whether the memory device is operating is determined (step S501). If the memory device is not operating, it indicates that the memory device stops operating and terminates. If the memory device is operating, the clock frequency of a system clock signal is regularly determined (step S503). For example, the clock frequency may be inferred by counting the pulse wave number corresponding to the clock signal in the predetermined period. Then, the set value corresponding to the clock frequency in the look-up table is determined (step S505). Subsequently, the internal supply voltage is adjusted to the set value (step S507) to achieve a preferable operating performance. Afterward, it is returned to step 503 to repeat the procedure from steps S503 to S507.

Returning to step S505, in addition to step S507, steps S509 or S513 may be performed immediately after step S505. At step 509, comparison between values of the clock frequency and the first frequency is made or variation of the clock frequency is determined. If the clock frequency is lower than the first frequency (or is in the frequency-dropping state), a disable signal is provided to turn off an unnecessary element (step S511). At step 513, comparison between values of the clock frequency and the second frequency is made or variation of clock frequency is determined. If the system frequency is higher than the second frequency (or is in the frequency-elevating state), an enable signal is provided to turn on an element to be operated (step S515). If an outcome at step S509 or step S513 is no, it is returned to step S501. It should be noted that the disclosure does not limit on a condition of turning on or off an element. For example, an element may be enabled and turned on at step S511, while an element may be disabled and turned off at step S515.

Figure 6:
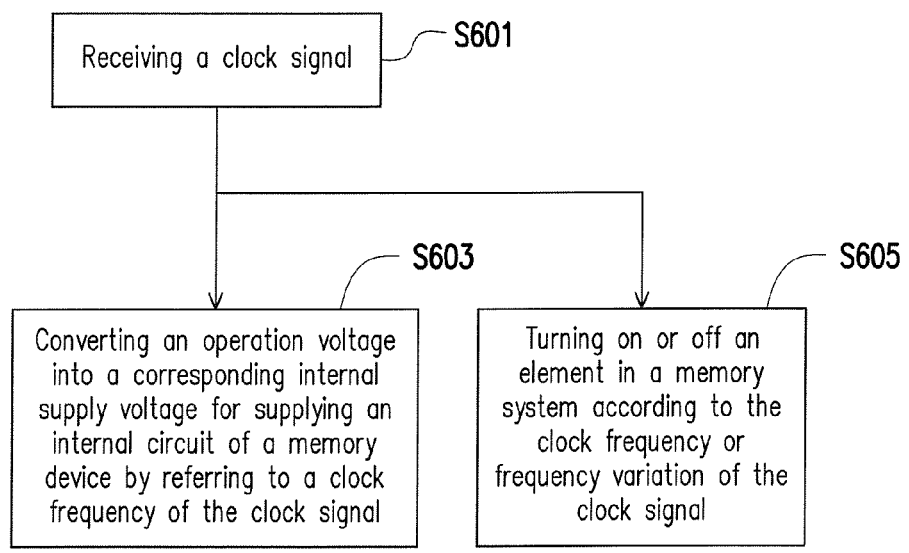
FIG. 6 is a flowchart of a voltage control method of a memory device according to an embodiment of the disclosure.

Referring to FIG. 6, FIG. 6 is a flowchart illustrating a voltage control method of a memory device of an embodiment of the disclosure.

The memory device receives a clock signal (step S601) and then converts an operation voltage into the corresponding internal supply voltage by referring to the clock frequency of the clock signal for supplying an internal circuit of the memory device (step S603). This step may use a look-up table to set a value of the internal supply voltage, wherein the look-up table stores a set of feature values corresponding to the internal supply voltage. The feature value is the clock frequency or pulse wave number of the clock signal. In an embodiment, whether the clock signal is in the frequency-elevating or frequency-dropping state may be further determined. When the clock signal is in the frequency-elevating state, the internal supply voltage is tuned up. When the clock signal is in the frequency-dropping state, the internal supply voltage is tuned down.

In another exemplary embodiment, the disclosure may further turn on or off an element in the memory system by referring to the clock frequency or frequency variation of the clock signal, wherein the memory system includes elements inside the memory device and other external elements (step S605). For example, when the clock frequency of the clock signal is lower than the first frequency (or is in the frequency-dropping state), a disable signal is provided to turn off an element that needs not to be operated, whereas when the clock frequency of the clock signal is higher than the second frequency (or is in the frequency-elevating state), an enable signal is provided to turn on an element to be operated.

In view of the above, the disclosure automatically adjusts a level of the internal supply voltage by detecting the clock frequency or frequency variation of the clock signal. When it is detected that an external clock frequency is elevated, the internal supply voltage is automatically elevated to achieve a preferable performance. When it is detected that the external clock frequency is dropped, the internal supply voltage is automatically dropped to maintain normal functioning without an inaccurate operation. In addition, if it is detected that the external clock frequency is higher than a frequency (or in the frequency-elevating state), an enable signal may also be provided to another element. Thereby, the responding speed of the memory device to high frequency may also be improved. Similarly, if the clock frequency is lower than a frequency (or is in the frequency-dropping state), a disable signal may also be provided to completely turn off an unnecessary element to reduce power consumption.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A voltage control method of a memory device, wherein the memory device comprises a memory cell, a voltage regulator circuit, and a control circuit, comprising:
   receiving, by the control circuit, a clock signal; and
   converting, by the voltage regulator circuit, an operation voltage into a corresponding internal supply voltage by referring to a clock frequency of the clock signal for supplying an internal circuit of the memory device, wherein the internal supply voltage corresponding to the clock frequency is obtained from a look-up table having a set of feature values corresponding to the internal supply voltage according to the clock frequency of the clock signal.

2. The voltage control method of the memory device as claimed in claim 1, wherein referring to the clock frequency of the clock signal comprises:
   counting, by the control circuit, a pulse wave number of the clock signal during a predetermined period.

3. The voltage control method of the memory device as claimed in claim 1, wherein converting the operation voltage into the corresponding internal supply voltage comprises:
   using the look-up table to set a value of the internal supply voltage, wherein the look-up table stores the set of feature values, and one of the set of feature values corresponding to the internal supply voltage.

4. The voltage control method of the memory device as claimed in claim 1, wherein the one of the set of feature values corresponding to the internal supply voltage is the clock frequency or a pulse wave number of the clock signal.

5. The voltage control method of the memory device as claimed in claim 1, wherein converting the operation voltage into the corresponding internal supply voltage for supplying the internal circuit by referring to the clock frequency of the clock signal comprises:
   determining whether the clock frequency is in a frequency-dropping state, wherein if the clock frequency is in the frequency-dropping state, tuning down the internal supply voltage, and if the clock frequency is in a frequency-elevating state, tuning up the internal supply voltage.

6. The voltage control method of the memory device as claimed in claim 1, further comprising:
   turning, by the control circuit, on or off an element in a memory system according to the clock frequency or frequency variation, wherein the memory system comprises an element in the memory device or another external device.

7. The voltage control method of the memory device as claimed in claim 6, wherein turning on or off the element in the memory system according to the clock frequency or frequency variation comprises:
   when the clock frequency is lower than a first frequency, providing a disable signal to turn off an element that needs not to be operated.

8. The voltage control method of the memory device as claimed in claim 6, wherein turning on or off the element in the memory system according to the clock frequency or frequency variation comprises:
   when the clock frequency is higher than a second frequency, providing a disable signal to turn on an element to be operated.

* * * * *